United States Patent
Usui et al.

(10) Patent No.: US 7,189,588 B2
(45) Date of Patent: Mar. 13, 2007

(54) GROUP III NITRIDE SEMICONDUCTOR SUBSTRATE AND ITS MANUFACTURING METHOD

(75) Inventors: Akira Usui, Tokyo (JP); Masatomo Shibata, Ibaraki (JP); Yuichi Oshima, Ibaraki (JP)

(73) Assignees: NEC Corporation, Tokyo (JP); Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/519,571

(22) PCT Filed: Jul. 1, 2003

(86) PCT No.: PCT/JP03/08360

§ 371 (c)(1),
(2), (4) Date: Mar. 9, 2005

(87) PCT Pub. No.: WO2004/006312

PCT Pub. Date: Jan. 15, 2004

(65) Prior Publication Data

US 2006/0046325 A1    Mar. 2, 2006

(30) Foreign Application Priority Data

Jul. 2, 2002    (JP) .............................. 2002-193733

(51) Int. Cl.
*H01L 21/00* (2006.01)

(52) U.S. Cl. ............................ 438/22; 438/48; 438/46; 438/93; 257/E21.059

(58) Field of Classification Search ................. 438/46, 438/47, 48, 974, 93
See application file for complete search history.

(56) References Cited

U.S. PATENT DOCUMENTS

| 4,849,260 A * | 7/1989 | Kusumoto et al. .......... 427/250 |
| 6,303,405 B1 * | 10/2001 | Yoshida et al. ............... 438/46 |
| 6,800,501 B2 * | 10/2004 | Miki et al. ..................... 438/29 |
| 6,924,159 B2 * | 8/2005 | Usui et al. ..................... 438/22 |

FOREIGN PATENT DOCUMENTS

EP    1 271 627    1/2003

(Continued)

OTHER PUBLICATIONS

By Tsvetanka S. Zheleva et al., "Pendeo-Epitaxy—A New Approach for Lateral Growth of Gallium Nitride Structures", MRS Internet J. Nitride Semicond. Res. 4S1, G3.38, 1999, pp. 2-7.

(Continued)

*Primary Examiner*—Michael Lebentritt
*Assistant Examiner*—Elias Ullah
(74) *Attorney, Agent, or Firm*—Young & Thompson

(57) ABSTRACT

The present invention provides a group III nitride semiconductor substrate with low defect density as well as small warp and a process for producing the same; for instance, the process according to the present invention comprises the following series of steps of: forming a metallic Ti film 63 on a sapphire substrate 61, followed by treatment of nitration to convert it into a TiN film 64 having fine pores; thereafter growing a HVPE-GaN layer 66 thereon; forming voids 65 in the HVPE-GaN layer 66 by means of effects of the metallic Ti film 63 and the TiN film 64; and peeling the sapphire substrate 61 from the region of the voids 65 to remove it therefrom.

33 Claims, 5 Drawing Sheets

FOREIGN PATENT DOCUMENTS

| | | |
|---|---|---|
| JP | 63-188983 | 8/1988 |
| JP | 10-312971 | 11/1998 |
| JP | 2000-012900 | 1/2000 |
| JP | 2000-228539 | 8/2000 |
| JP | 2001-223165 | 8/2001 |
| JP | 2001-284643 | 10/2001 |
| JP | 2002-050585 | 2/2002 |
| JP | 2002-050586 | 2/2002 |
| JP | 2002-343718 | 11/2002 |
| JP | 2003-178984 | 6/2003 |

OTHER PUBLICATIONS

By Ok-Hyun Nam et al., "Lateral Epitaxy of Low Defect Density GaN Layers Via Organometallic Vapor Phase Epitaxy", Appl. Phys. Lett., 71 (18), Nov. 3, 1997, pp. 1-4.

By Masaru Kuramoto et al., "Room-Temperature Continuous-Wave Operation of InGaN Multi-Quantum-Well Laser Diodes Grown on an n-GaN Substrate with a Backside n-Contact", Japanese Journal of Applied Physics, vol. 38, No. 2B, Feb. 15, 1999, pp. 1-4.

By Michael Kelly et al., "Large Free-Standing GaN Substrates by Hydride Vapor Phase Epitaxy and Laser-Induced Liftoff", Japanese Journal of Applied Physics, vol. 38, No. 3A, Mar. 1, 1999, pp. 1-4.

* cited by examiner (a)

(b)

GROUP III NITRIDE SEMICONDUCTOR SUBSTRATE AND ITS MANUFACTURING METHOD

TECHNICAL FIELD

The present invention relates to a self-supported substrate of group III nitride semiconductor and a process for production thereof.

BACKGROUND ART

GaN based compound semiconductor such as gallium nitride (GaN), indium gallium nitride (InGaN) and gallium aluminum nitride (AlGaN) is drawing attention as a material for blue emission light-emitting diode (LED) or laser diode (LD). Further, development for application of GaN based compound semiconductor in elements for electronic devices is taken up by employing such a merit that it is excellent in heat resistance and environment resistance.

As there is difficulty in bulk crystal growth of GaN based compound semiconductor, it is hard to obtain a bulk substrate made of GaN capable of bearing the load of practical use. As of now, a substrate that is put to wide practice use for growing GaN thereon is just sapphire substrate, and such approach is generally employed that GaN is grown epitaxially on a single crystalline sapphire substrate by means of such growth technique as organometallic vapor phase epitaxyl (MOVPE).

Meanwhile, there is difference in lattice constant between the sapphire substrate and GaN; therefore, at such a case that GaN is grown directly on a sapphire substrate, it is impossible to grow a single crystalline film thereof. Hence, worked out (JP-A-63-188983) was such a process where a buffer layer of AlN or GaN was grown at a low temperature in advance on a sapphire substrate, which resulted in relaxation of the strain of lattice with use of the low-temperature-grown buffer layer, and then GaN was successfully growth thereon. Use of said low-temperature-grown nitride layer as a buffer layer has made single-crystalline epitaxial growth of GaN. Even in this method, however, there is no help for the lattice mismatch between the substrate and GaN crystal, and thus the GaN obtained therein has a number of defects. There is such anticipation that the defects will play new hurdles on the road to production of GaN based LD. Further, in recent years, as for method of reducing the density of the defects which are generated owing to the difference in lattice constant between sapphire and GaN, there have been reported growth techniques, such as ELO [Appl. Phys. Lett. 71 (18) 2638 (1997)], FIELO (Facet-initiated Epitaxial Lateral Over-growth) [Jpn. J. Appl. Phys. 38, Part 2, No. 2B, L184 (1999)] and pendeo epitaxy [MRS Internet J. Nitride Semicond. Res. 4S1, G3. 38 (1999)]. As a result, GaN epitaxial wafers having significantly improved crystal quality have come to be obtained.

DISCLOSURE OF THE INVENTION

On the other hand, even though Techniques such as ELO, FIELO have made it possible to grow a single-crystalline GaN layer with low defect density, such problem for said epitaxial wafers remains to be solved that a warp of the substrate resulted from the difference in lattice constant and thermal expansion coefficient between sapphire and GaN. When a wrap is present in the substrate, during handling such substrate, it is easy to induce cracks therein. Additionally, when a pattern of mask is printed on such substrate at such a step as photolithography step in device production process, it is hard to uniformly adjust the focus over the whole surface of substrate, which leads to decreased yield in the process of device production. Thus, it is highly needed to develop a GaN epitaxial substrate that is low in defect density and free from a warp. In contrast, it is more desired to obtain a GaN bulk substrate having low defect density and no warp therein, but as it is very difficult to make preparation of a large-size bulk GaN crystal, such a substrate of practical use has not been obtained yet.

Recently, there has been proposed a process in which a thick GaN film is grown hetero-epitaxially on a substrate by means of HVPE method (hydride vapor phase epitaxial growth method) and then the substrate is removed therefrom to obtain a GaN self-supported substrate. However, regarding this process, there has not yet been developed such a technique that the GaN grown on the sapphire substrate can be separated from the sapphire substrate by etching. There have been attempts to employ a method of mechanically removing the sapphire substrate by polishing; however, it has been found that breakage of substrate may result from an increased warp of substrate which is occasionally induced during the polishing, and therefore the process has not been reached the level of practical use. In Jpn. J. Appl. Phys. Vol. 38 (1999) Pt. 2, No. 3A L217 to L219 is reported a process in which GaN is grown up to a thick thickness on a sapphire substrate by a HVPE method and then laser pulses are irradiated thereon to peel off only the GaN layer therefrom. However, even as for this process, there remains a problem that the substrate tends to crack easily. In JP-A-2000-12900 is disclosed a process with a easily removable substrate, such as a process in which GaN is grown up to a thick thickness on a GaAs substrate by a HVPE method and then the GaAs substrate is etched to be removed therefrom. With this process, a large size GaN substrate can be obtained at a relatively high yield; however, there is such a problem to be solved that the GaAs substrate decomposes during the growth of the GaN crystal, and thus As will be incorporated into the GaN as a contaminant. Selective growth using a patterned mask, such as FIELO mentioned above, is effective in order to reduce the defect density in epitaxially grown GaN, and there are disclosed techniques such as that proposed in JP-A-H-10-312971. These techniques, however, have not yet been applied in practical production of self-supported GaN substrate because there has been no technique for easy peeling off the substrate.

In view of the aforementioned situation, the present invention aims at providing a group III nitride semiconductor substrate having low defect density and a little warp.

According to the present invention, there is provided a process for producing a group III nitride semiconductor substrate, characterized in that the process comprises steps of:

forming a film containing metal element on a base substrate, forming a group III nitride semiconductor layer including region of voids therein on the metal element-containing film to be brought into direct contact therewith, and peeling said base substrate with use of said region of voids as the site for peeling to take it away.

According to the present invention, there is also provided a process for producing a group III nitride semiconductor substrate, characterized in that the process comprises steps of:

forming a film containing metal element on a base substrate, growing a first group III nitride semiconductor layer on the metal element-containing film to be brought into direct contact therewith, heat-treating said metal element-containing film and said first group III nitride semiconductor layer at a temperature higher than said growth temperature for the first group III nitride semiconductor layer to form region of voids in said first group III nitride semiconductor layer, forming a second group III nitride semiconductor layer on said first group III nitride semiconductor layer, and peeling said base substrate with use of said region of voids as the site for peeling to take it away.

According to the present invention, there is also provided a process for producing a group III nitride semiconductor substrate, characterized in that the process comprises steps of:

forming, on a base substrate, a metal element-containing film having a fine pore structure therein, forming a group III nitride semiconductor layer including region of voids therein on the metal element-containing film to be brought into direct contact therewith, and peeling said base substrate with use of said region of voids as the site for peeling to take it away.

According to the present invention, there is also provided a process for producing a group III nitride semiconductor substrate, characterized in that the process comprises steps of:

forming, on a base substrate, a metal element-containing film, at least the surface of which is composed of a metal nitride, carrying out treatment for elimination of the nitrogen contained in said metal nitride, forming a group III nitride semiconductor layer including region of voids therein on the metal element-containing film to be brought into direct contact therewith, and peeling said base substrate with use of said region of voids as the site for peeling to take it away.

According to the present invention, there is also provided a process for producing a group III nitride semiconductor substrate, characterized in that the process comprises steps of:

forming, on a base substrate, a metal element-containing film, at least the surface of which is composed of a metal nitride, growing a group III nitride semiconductor layer on the metal element-containing film to be brought into direct contact therewith under condition that a V/III ratio of raw material gas is set to be 10 or less to form group III nitride semiconductor layer including region of voids therein, and peeling said base substrate with use of said region of voids as the site for peeling to take it away.

Further, According to the present invention, there is provided a process for producing a group III nitride semiconductor substrate, characterized in that the process comprises step of:

forming, on a base substrate, a group III nitride semiconductor layer including a porous layer therein, and thereafter peeling the base substrate with use of the porous layer as the site for peeling to take it away.

In addition, according to the present invention, there is also provided a group III nitride semiconductor substrate obtained by any one of the production processes defined above.

The present invention is an invention having such a feature in which a group III nitride semiconductor layer having region of voids is formed over a substrate via a metal element-containing film, and thereafter the base substrate is peeled with use of the region of voids used as the site of peeling to take it off. The metal element-containing film plays a role in the step of forming a group III nitride semiconductor layer with good quality thereon and forming voids in the group III nitride semiconductor layer. The region of voids functions as a region for strain-relaxing, and thereby it will improve the crystal quality of the group III nitride semiconductor layer formed thereon, and will enable easy peeling and removal of the base substrate.

As to the form of the region of voids being present in the group III nitride semiconductor layer, there is no particular restriction. However, it is preferred that the region of voids is shaped in a layer form upon the metal element-containing film. By choice of this form, a group III nitride semiconductor layer containing a porous layer is formed stably, which can reduce the strain remaining in the group III nitride semiconductor layer effectively. Further, the peeling and removal of the base substrate becomes easier, and typically, the spontaneous peeling of the base substrate becomes possible in the cooling-down stage post to the growth of a group III nitride semiconductor layer, without going through any particular process for peeling off.

In the present invention, various methods can be employed for the formation of the region of voids. It is possible that a metal having a decomposing action on group III nitride semiconductor is used to from a metal element-containing film, and then the region of voids may be formed due to the decomposing action thereof. Alternatively, the metal element-containing film is allowed to have a fine pore structure, and then a group III nitride semiconductor layer is formed thereon, whereby can be formed a group III nitride semiconductor layer containing the region of voids in the vicinity of the interface with the metal element-containing film.

Also in the processes heretobefore in use, there were some cases that voids have been introduced into the group III nitride semiconductor layer formed on a substrate. For example, when mask-growth is carried out using silicon oxide masks in the process for ELO growth described in the section of Background Art, there are occasions that the masks are not buried completely by GaN, which leads to some voids being left therein. Also in the mask-growth using tungsten masks, there are some cases that GaN and tungsten react with each other on the masks, resulting in formation of voids. These, however, are cases that undesired voids are unintentionally introduced on masks, but far from such cases that the base substrate would be peeled off with use of the voids as the site of peeling. Furthermore, these voids can never fulfill such functions for stress relaxation or assistance of base substrate peeling as used in the present invention. In contrast, the present invention, which involves voids being formed by the chemical action or physical action of the metal element-containing film, takes following effects and functions.

Firstly, there can be obtained a group III nitride semiconductor substrate that is low in defect density and superior in crystal quality. It is because the region containing voids functions as a strain-relaxing region, which can successfully relax the strain due to the difference in lattice constant or thermal expansion coefficient between base substrate and group III nitride semiconductor layer.

Secondly, the warp of the semiconductor substrate obtained can be reduced remarkably, whereby such effect as the improvement in yield can be achieved in the photolithography step of device process. It is because the layer including voids functions as a strain-relaxing region, which can successfully lighten the strain caused by the difference in lattice constant or thermal expansion coefficient between base substrate and group III nitride semiconductor layer.

Thirdly, the removal of substrate is easily performed, whereby such a self-supported substrate of GaN single crystal can be easily obtained that has a large size, is free from crack or flaw and is well shaped. It is because a layer having voids is lying between a base substrate and a group III nitride semiconductor layer, which enables easy removal of the base substrate by spontaneous peeling, or by means of chemical solution or mechanical impact.

Figure 1:
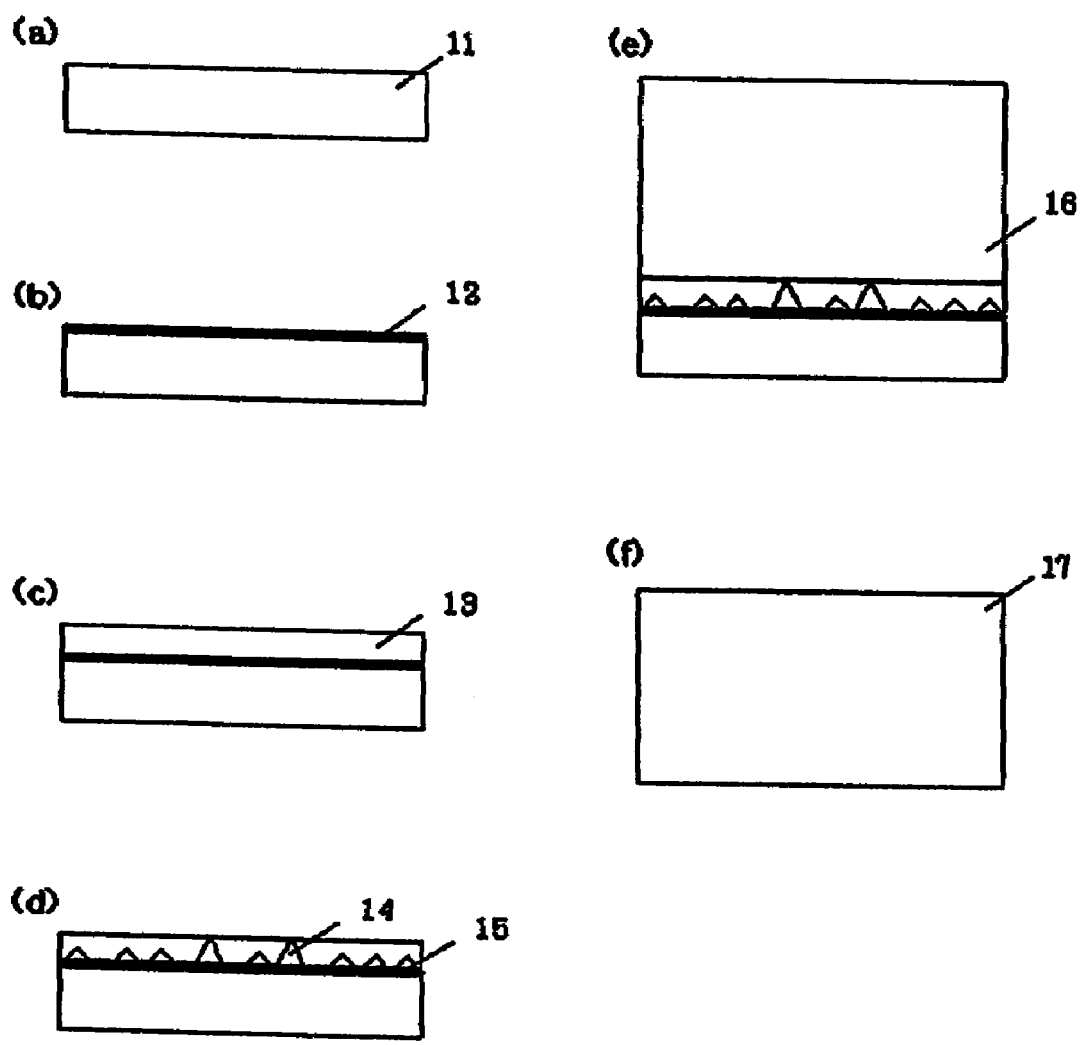
FIGS. 1(a) to 1(f) are each a sectional view showing a step in the process for production of semiconductor substrate according to the present invention, used in Example 1.

In the drawings, each numerical symbol has the following meaning.

11: Sapphire substrate
12: Metal Ti film
13: the First GaN layer
14: Void
15: TiN film
16: the Second GaN layer
17: Self-supported GaN substrate
31: Sapphire substrate
32: GaN layer
34: TiN film
35: Void
36: HVPE grown-GaN layer
37: Self-supported GaN substrate
61: Sapphire substrate
62: GaN layer
63: Metal Ti film
64: TiN film
65: Void
66: HVPE grown-GaN layer
67: Self-supported GaN substrate

BEST MODE FOR CARRYING OUT THE INVENTION

The present invention is a process comprising steps of:
forming a metal element-containing film on a base substrate;
forming a group III nitride semiconductor layer including region of voids therein on the metal element-containing film to be brought into direct contact therewith, and
peeling said base substrate with use of said region of voids as the site for peeling to take it away. Detailed explanation is made hereafter by categorizing the methods for stably and controllably forming voids in such a structure that can relax strain sufficiently and which enables easy peeling of substrate into the groups of I to IV types.

Type I

The production process of type I comprises steps of
forming a film containing metal element on a base substrate,
growing a first group III nitride semiconductor layer on the metal element-containing film to be brought into direct contact therewith,
heat-treating said metal element-containing film and said first group III nitride semiconductor layer at a temperature higher than said growth temperature for the first group III nitride semiconductor layer to form region of voids in said first group III nitride semiconductor layer,
forming a second group III nitride semiconductor layer on said first group III nitride semiconductor layer. In this production process, even though the metal element-containing film may be a metal oxide film, a metal nitride film or the like; however, it is preferably a metal film composed of a single metal alone. It is because when the metal film is employed, it is easy to provide a striking decomposing action on group III nitride semiconductor.

According to this production process, as the growth of a group III nitride semiconductor layer on a metal element-containing film is conducted using a low-temperature process; the growth of the layer can be allowed to take place in a state that the surface of the metal element-containing film maintains a high catalytic activity. For example, in case that a group III nitride semiconductor layer is formed on a film composed of a metal simple substance, growth of the layer is not easy in general; however, by employing the low-temperature process, a layer of relatively good crystalline quality can be obtained. That is, according to the present production process, a group III nitride semiconductor layer of good quality can be grown while the catalytic activity of the metal element-containing film is kept in high level, and thus a group III nitride semiconductor substrate of superior quality can be obtained.

The growth temperature for the first group III nitride semiconductor layer is preferably in range of 400° C. or higher but 800° C. or lower. By selecting such a condition, it is possible to preferably grow a group III nitride semiconductor layer on the metal element-containing film. As mentioned above, in case that a metal film composed of a single metal alone is used as the metal element-containing film, growth of a group III nitride semiconductor layer thereon is difficult; however, with use of such a low growth temperature, the layer can be grown stably.

The heat treatment for forming region of voids is carried out preferably at a temperature of 900° C. or higher but 1,400° C. or lower. By choosing such a condition, there can be stably and controllably formed voids having a structure which can relax strain sufficiently and which enables easy peeling of substrate. Incidentally, this heat treatment may be performed, for example, in an atmosphere of nitrogen gas, oxygen gas, hydrogen gas or the mixture thereof. However, a gas containing nitrogen atom, such as nitrogen gas or ammonia gas, is preferably employed therefor. By selecting this nitrogen-containing atmosphere, region of voids can be formed preferably. This heat treatment step may not be specially arranged as a distinct step, and voids may be formed by the heat treatment that is associated with growth of the second group III nitride semiconductor layer. For example, in epitaxial growth of a GaN semiconductor, the growth is conducted generally at a temperature of 1,000° C. or higher; therefore, by growing a GaN layer at such a temperature using the metal element-containing film as a base layer therefor, there can be stably obtained a GaN layer having region of voids in the vicinity of the interface with the metal element-containing film.

The thickness of the first group III nitride semiconductor layer is preferably 20 nm or more, more preferably 50 nm or more, but is preferably 2,000 nm or less, more preferably 1,000 nm or less. By choosing said thickness, while the crystalline quality of group III nitride semiconductor layer can be kept good, voids can be formed stably and controllably in the layer.

Type II

The production process of type II comprises steps of:

forming, on a base substrate, a metal element-containing film having a fine pore structure therein, and forming a group III nitride semiconductor layer including region of voids therein on the metal element-containing film to be brought into direct contact therewith. As for the metal element-containing film having a fine pore structure, it is preferred that at least the surface thereof composed of a metal nitride. With this, a group III nitride semiconductor layer of good quality can be epitaxially grown on the metal element-containing film.

The metal element-containing film having a fine pore structure can be obtained by forming a film of metal material being not lattice-matched with the surface of base substrate (in case that the metal element-containing film is formed directly on a hetero-substrate, with the surface of hetero-substrate, or else in case that a group III nitride semiconductor film has been formed on a hetero-substrate, with the group III nitride semiconductor film), using a method and conditions for film formation in which relatively high crystalline quality thereof can be attained. Since its crystal structure is distinct from that of the base substrate and also their lattice constants are different from each other, it is considered that a large residual strain is generated in the film, which gives rise to the fine pore structure. When a group III nitride semiconductor layer is grown thereon, the group III nitride semiconductor layer partakes of the epitaxial information of the base substrate through the fine pores, and thereby a large number of fine voids are produced in the group III nitride semiconductor layer.

The aforementioned structure with fine pores can be produced by control of film formation conditions. It may also be produced by conducting an appropriate heat treatment after the formation of a metal film or a metal nitride film. The conditions of heat treatment for voids formation are selected appropriately depending upon the material of the metal element-containing film. For instance, when a titanium film has been formed, the temperature of heat treatment is preferably 700° C. or higher, more preferably 800° C. or higher. Too low a temperature may reduce the efficiency of voids formation. With respect to the upper limit of heat treatment temperature, it is appropriately set up based on such a factor as the material for film formation, and thus, in the case of GaN type material, it is preferably 1,400° C. or lower.

Type III

The production process of type III comprises steps of:

forming, on a base substrate, a metal element-containing film, at least the surface of which is composed of a metal nitride, carrying out treatment for elimination of the nitrogen contained in said metal nitride, and forming a group III nitride semiconductor layer including region of voids therein on the metal element-containing film to be brought into direct contact therewith. According to this production process, the catalytic activity of the surface of the metal element-containing film is improved, and thereby voids can be formed more stably in the group III nitride semiconductor layer.

In this production process, the metal element-containing film can be formed by a process in which a metal film is formed on a base substrate and then the metal film is subjected to the treatment for nitrification, or by a process for forming a metal nitride film on a base substrate. Said treatment for elimination of nitrogen may be such a treatment as contacting the metal element-containing film with a reducing atmosphere. The reducing atmosphere refers to such an atmosphere that contains hydrogen, ammonia or the like therein.

Type IV

The production process of type IV comprises steps of:

forming, on a base substrate, a metal element-containing film, at least the surface of which is composed of a metal nitride, and growing a group III nitride semiconductor layer on the metal element-containing film to be brought into direct contact therewith under condition that a V/III ratio of raw material gas is set to be 10 or less to form group III nitride semiconductor layer including region of voids therein. With this process, the lateral growth of a group III nitride semiconductor layer on the metal element-containing film is enhanced, which can form voids preferably.

As to the processes according to the present invention as well as the materials used therein, various constitutions can be employed. Explanation of such constitutions is given below.

In the present invention, the metal element-containing film may be formed on the whole surface of the base substrate. Thereby, voids can be formed over the whole surface of the base substrate, which can relax strain more effectively, and can make it much easier to peel off the base substrate.

In the present invention, the metal element-containing film may be a film containing a metal element which has a catalytic activity capable of promoting the decomposition of group III nitride semiconductor. Such a metal element can be exemplified by transition elements, particularly d-block transition elements. Among those, preferred is one element or two or more elements selected form the group consisting of scandium, yttrium, titanium, zirconium, hafnium, vanadium, niobium, tantalum, tungsten, chromium, molybdenum, tungsten, rhenium, iron, ruthenium, osmium, cobalt, rhodium, iridium, nickel, palladium, manganese, copper, platinum and gold. By using such a material, voids can be formed in preferable shape in the group III nitride semiconductor layer.

Of the above metal elements, titanium, zirconium, hafnium, tantalum, tungsten, platinum, cobalt and nickel are particularly preferred because they can give rise to easy formation of voids in the group III nitride semiconductor layer. Further, as titanium, zirconium, hafnium, tantalum and tungsten are relatively stable even at the growth temperature for a group III nitride semiconductor layer, they can be used preferably in the present invention. However, when tungsten is selected, the decomposition of GaN can be initiated thereby even at a low temperature of about 600° C., whereby voids may be generated rapidly, and thus there are some cases where care may need to be taken in handling thereof.

Even though the mechanism by which the above metal forms voids in the group III nitride semiconductor layer is not completely revealed, it is presumed that the metal functions as a catalyst for the group III nitride semiconductor, whereby the decomposition thereof will be promoted.

In the present invention, the metal element-containing film is preferred to further satisfy the following conditions.

(i) It can transmit the orientation of the base substrate so that a group III nitride semiconductor layer can be epitaxially grown on such a metal element-containing film preferably. It is desired that the metal element-containing film has a hexagonal or cubic crystal system and is orientated on the base substrate in the direction of [0001] axis in the case of hexagonal system or in the direction of [111] axis in the case of cubic system.

(ii) The melting point or decomposition-starting temperature of the metal element-containing film is higher than the growth temperature for a group III nitride semiconductor layer being formed thereon so that its film form can be well kept at the growth temperature.

(iii) The vapor pressure of the metal element-containing film at the growth temperature for a group III nitride semiconductor layer being grown thereon is sufficiently low so that no sublimation thereof takes place at the growth temperature.

(iv) The metal element-containing film does not react, at the growth temperature for a group III nitride semiconductor layer being grown thereon, to the nitride semiconductor as well as its raw material gases or an atmospheric gases (e.g. ammonia gas or hydrogen gas) so that its crystal orientation does not go out of order.

By using a metal element-containing film satisfying these conditions, a group III nitride semiconductor substrate that is much superior in crystalline quality can be obtained.

The metal element-containing film used in the present invention may be a film made of a single metal alone or of a metal compound, and may be a single-layer film or a composite film being layer-built with two or more kinds of layers. Preferably, it is a metal film, a metal nitride film or a layer-built up product thereof.

As the metal element-containing film used in the present invention should fulfill its role of a base layer for growing a group III nitride semiconductor layer of good crystalline quality thereon; it is preferred that at least part of the surface thereof is made of a metal nitride. By employing this constitution, a group III nitride semiconductor can be grown preferably at temperatures for the conventional film deposition. From such a reason, it is preferred to select a metal element which is easily nitrified, as a material constituting the metal element-containing film. From such a standpoint, the metal element that constitutes the metal element-containing film is preferably titanium, tantalum, tungsten or the like. Incidentally, when a film made of such metal as titanium is exposed to an atmosphere used for the growth of a group III nitride semiconductor, the surface thereof is nitrified, and therefore there is no necessity to specially arrange further step for nitrification. However, an independent step may be provided with the purpose of control of nitrification degree. Further, it is also possible to conduct nitrification of titanium simultaneously with formation of voids by introducing, into a heat treatment atmosphere used in the step of forming voids, nitrogen gas or a gas of compound containing nitrogen atom together with hydrogen gas. Incidentally, in the type I process mentioned above, as growth of a group III nitride semiconductor on a metal element-containing film is conducted at a low temperature, the metal element-containing film for such a case can be composed of a single metal alone.

In addition, as the metal element-containing film used in the present invention also has a role of acting towards a group III nitride semiconductor layer formed thereon to generate voids therein, it is preferred that a facet showing high catalytic activity such as that of a single metal alone is exposed at least upon part of the surface of the metal element-containing film. Here, the surface of the metal element-containing film refers to the upper surface thereof when the film is a flat film and, when the film is a film having fine pores, refers to both of the inner walls of the pores and the upper surface of the film. When a facet showing high catalytic activity such as that of a single metal alone is exposed at these sites, a group III nitride semiconductor layer containing voids therein can be formed preferably.

The thickness of the metal element-containing film used in the present invention can be determined appropriately based upon such a factor as the material thereof, and for example, It is set to be 3 nm or thicker, more preferably 5 nm or thicker. On the other hand, the upper limit of the thickness of the metal element-containing film is 500 nm or thinner, more preferably 50 nm or thinner. With such a choice, the crystalline quality of the group III nitride semiconductor layer that is formed on the metal element-containing film can be kept in good level, and voids can be formed in preferable manner on the metal element-containing film.

As a technique for depositing the metal element-containing film, such a method as evaporation, sputtering, or various types of CVD is applicable. The metal element-containing film is desired to have a flat surface and cover the whole surface of the base substrate, and may be formed in such a structure having fine pores in the film. When being formed in such a structure having fine pores, it is possible to effectively reduce the defect density in the group III nitride semiconductor layer formed on the metal element-containing film. The group III nitride semiconductor layer can be grown so as to cover over the pores.

Referring to such a case that titanium is chosen as the material of the metal element-containing film by way of example, it is desired that The heat treatment in which the metal film is nitrified to form almost uniform pores therein is carried out at temperatures of 700° C. or higher but 1,400° C. or lower. The reason is that at a temperature of lower than 700° C., nitrification reaction can never progress just enough to form almost uniform pores. In the case where a nitride semiconductor substrate or a nitride semiconductor epitaxial wafer is used as the base substrate, at temperatures exceeding 1,400° C., pyrolysis of a layer of single-crystalline gallium nitride may progress excessively, and there are some fears that the metal nitride film may be peeled therefrom. Said heat treatment for nitrification of the metal film to form almost uniform pores therein is conducted desirably in an atmosphere containing nitrogen gas or gas of a nitrogen-containing compound. By selecting such heat treatment condition, there can be formed a film having fine pores, which is capable of forming voids with preferable shape in a group III nitride semiconductor layer.

In the present invention, it is possible to appropriately adjust the conditions for formation of a metal element-containing film, or it is possible to perform a further step of surface treatment of the metal element-containing film, after formation of a metal element-containing film but before formation of a group III nitride semiconductor layer thereon. By applying this surface treatment, (i) the decomposing action (catalytic action) for group III nitride semiconductor which the metal element-containing film possesses can be exhibited in a sufficient manner, or (ii) the lateral growth of a group III nitride semiconductor layer is promoted, which gives rise to formation of a bridge-like structure on the metal element-containing film, as a result, the region of voids having a high stress-relaxing effect and a high substrate-peeling effect can be formed more stably therein.

Examples of methods for such a surface treatment are explained below.

Method 1

The rate of formation of a metal element-containing film is chosen at 1 nm/s or less. Thereby, the orientation of the metal element-containing film is maintained appropriately, which makes possible the preferable formation of voids having a high stress-relaxing effect and a high substrate-peeling effect. In the case of, for example, Ti, when the rate of evaporation is set at 1 nm/s or less, the [0001] orientation of Ti is maintained well so that good crystalline quality can be obtained after the film is nitrified. As a result, deposition of island-shaped crystals having a crystal orientation different from each other on the surface of the nitride film can be prevented, whereby voids intended in the present invention can be formed preferably.

Method 2

The thickness of the metal element-containing film is adjusted properly. For instance, the thickness of the metal element-containing film is chosen in 5 nm to 50 nm. Thereby, the crystal quality of the group III nitride semiconductor layer formed on the metal element-containing film can be kept in a good level so that voids can be formed in preferable manner on the metal element-containing film. In such a case that Ti is employed as the material for the metal element-containing film, the thickness of Ti is desirably 5 nm to 50 nm. It is because if Ti film is too thin, the size of pores resulted from treatment of nitrification is too large, and thus the area of TiN is quite small so that formation of voids is insufficient, which may make it hard to peel off therewith. On the other hand, it is also because if it is too thick so as to exceed 50 nm, the crystalline quality of the titanium nitride film may take a sharp turn to the worse, deposition of island-shaped crystals having a crystal orientation different from each other on the surface of the nitride film can occur more easily, consequently the lateral growth of a group III nitride semiconductor layer is blocked so that formation of voids becomes insufficient.

Method 3

Prior to the growth of a group III nitride semiconductor layer on the metal element-containing film, the surface of the metal element-containing film is subjected to a wet treatment. Thereby, the spontaneous oxide film on the metal element-containing film is removed so that the catalytic activity for formation of voids is exhibited sufficiently. As the wet treatment, such a method that it is immersed, for example, in HF for 30 minutes, followed by washing with water can be employed.

Method 4

The composition of the carrier gas used in growth of a group III nitride semiconductor layer on the metal element-containing film is adjusted properly. Thereby, the lateral growth of a group III nitride semiconductor layer on the metal element-containing film is promoted so that voids can be formed preferably. For example, when a group III nitride semiconductor layer is formed by HVPE, the carrier gas used for the growth thereof is chosen in such a composition containing 70% or more of an inert gas (e.g. $N_2$).

Method 5

The composition of the reaction gas used in growth of a group III nitride semiconductor layer on the metal element-containing film is adjusted properly. That is, the ratio of V/III is adjusted appropriately. Particularly, the V/III ratio is set at 10 or less. Thereby, the lateral growth of the group III nitride semiconductor layer on the metal element-containing film is promoted so that voids can be formed preferably.

Method 6

The doping profile employed in growth of a group III nitride semiconductor layer on the metal element-containing film is adjusted properly. For instance, when Si is introduced as an impurity to form a n type group III nitride semiconductor substrate, the concentration of Si atom is chosen in range of $5 \times 10^{17}$ cm$^{-3}$ or less in the course where, after the beginning of the growth, the thickness grown reaches up to 5 μm. The reason is that Si is doped in too high level, which may prevent the lateral growth thereof.

In the methods explained above, the growth temperature used for growth of a group III nitride semiconductor layer on the metal element-containing film is desirably 800° C. or higher. It is because the catalytic action of the metal constituting the metal element-containing film is exhibited at a temperature of said temperature or higher.

In the present invention, as for the method of growth of a group III nitride semiconductor layer, there can be employed various techniques including MOVPE method (organometallic vapor phase epitaxy), MBE method (molecular beam epitaxy) and HVPE method (hydride vapor phase epitaxy). Use of the HVPE method is desirable to the growth of a thick layer of group III nitride semiconductor in order to obtain a self-supported substrate of group III nitride semiconductor. It is because the rate of crystal growth thereby is higher so that a thicker layer can be obtained more easily. However, there can be used other method such as MOVPE method, or alternatively such a combinational use of plurality of growth methods that a group III nitride semiconductor is grown by the MOVPE method up to part way and then it is followed by growing group III nitride semiconductor up to thick thickness by the HVPE method.

In the growth of a group III nitride semiconductor layer according to the present invention, there can be used an inert gas or gas mixtures thereof with hydrogen or the like as a carrier gas therefor. The inert gas can include at least one kind selected from $N_2$, He, Ne, Ar, Kr or Xe. In the case of formation of a group III nitride semiconductor layer, such process may be also applicable that an inert gas such as nitrogen is used as the carrier gas for the initial stage of growth and then the carrier gas is switched over to hydrogen to grow a layer with excellent crystalline quality.

In the present invention, there is no particular limitation on type of the base substrate, and various types can be used. For instance, There can be listed up by way of example a substrate made of different material such as sapphire, silicon, SiC, Langacite, Al, or GaAs and a substrate composed of a group III nitride semiconductor such as GaN, AlN, or AlGaN. When, for example, sapphire is used, there can be used the C plane, the A plane, the R plane thereof. The base substrate may have an off angle, but it is preferred that the off angle thereof is 1° or less. By choosing the off angle of the base substrate within 1°, the orientation of the metal film thereon can be kept in good level so that a group III nitride semiconductor layer can be grown favorably on such metal film.

In the present invention, the base substrate may be those comprising substrates of the above-mentioned materials or may be also those having such a construction in which group III nitride semiconductor is optionally formed thereon via a buffer layer of a low temperature grown GaN.

In the present invention, the group III nitride semiconductor layer may be a layer made of various types of semiconductors, including GaN, AlGaN, InGaN, InAlGaN or the like. Among these, the portion thereof being close to the metal element-containing film, for instance, up to 100 nm over the the metal element-containing film is desired to be composed of GaN or AlGaN with Al content of 0.1 or less. It is because when such composition is chosen, voids preferable for stress relaxation and substrate peeling can be formed controllably in the vicinity of the metal element-containing film.

The thickness of the group III nitride semiconductor layer is desirably 1 μm or thicker. In the case that fine pores are present at the surface of the metal nitride film, at the initial stage of growth of a group III nitride semiconductor layer, the pores are traced onto the surface thereof. The pores are buried gradually and disappear finally; however, in order to fill up the pores so as to face the surface thereof resulting in a completely flat surface, the thickness of the group III nitride semiconductor layer is preferred to be 1 μm or thicker.

The ratio of voids to the group III nitride semiconductor layer is in the range of preferably 20% or more, more preferably 30% or more but of preferably 90% or less, more preferably 80% or less. If the ratio of voids is too small, the effect of strain relaxation is low; and thus there are some cases that effect for reducing the warp of substrate and for lessening the defect density may not be attained. Meanwhile, if the ratio of voids is too large, there are some occasions that during the growth of a group III nitride semiconductor layer on the metal element-containing film, peeling of the metal element-containing film takes place in partial, whereby crystal growth thereon may be prevented.

In the present invention, the step of forming a group III nitride semiconductor layer on a metal film can be carried out by the process which comprises steps of forming a mask having openings, on a metal film directly or via other layer and then epitaxially growing a group III nitride semiconductor layer to cover overt the opening and the mask by using the openings as initiation region for growth. When this mask growth technique is used, growth is originated from the openings of the mask, and then group III nitride semiconductor is epitaxially grown on the whole surface of a substrate in such manner as to cover first on the mask openings and sequentially over the mask. As for a growth technique therefor, there can be employed a method called ELO in which selective lateral growth is promoted and a method called FIELO in which selective mask growth is progressed while a facet structure is formed therewith.

In the present invention, after the step of forming a group III nitride semiconductor layer, the base substrate is peeled off to remove it. As for a method of removing the base substrate, there can be used variety of processes, such as a process in which, after the growth of a group III nitride semiconductor layer, atmospheric temperature is cooled down to give rise to spontaneous peeling of the base substrate, a process in which a stress is applied to the group III nitride semiconductor layer containing voids to mechanically peel the base substrate off, and a process in which the metal element-containing film or the region of voids in the group III nitride semiconductor layer is etched off to peel the base substrate off.

Next, explanation is made on an embodiment of the present invention wherein a Ti-containing film is used as the metal element-containing film.

The present inventors have found that when the group III nitride semiconductor layer formed on a film of particular metal such as Ti or Ni is subjected to a heat treatment, voids are formed in the group III nitride semiconductor layer.

(i) The catalytic activity of Ti/TiN is strikingly lowered at a lower temperature than 800° C.
(ii) GaN crystals can be grown on Ti at such a low temperature as 500° C. to 800° C.

Based on the above two findings, it has been revealed that when a substrate which is not decomposed by the action of Ti/TiN, for instance, such as a sapphire substrate is used, voids can be formed using such a technique as those illustrated in the following embodiments 1 to 3 by way of example.

(Embodiment 1)

The present embodiment 1 belongs to type I mentioned above. First, Ti is deposited on a sapphire substrate by evaporation. Then, a GaN film is grown thereon at a low temperature. Thereafter, it is heated up to generate voids in the low temperature grown GaN. Successively, a thick film of GaN is grown over at a high temperature; and after that, the sapphire substrate is removed by spontaneous peeling or etching to obtain a self-supported substrate.

(Embodiment 2)

The present embodiment 2 belongs to the aborementioned type II. The embodiment 2 is a process in which voids are formed above the metal element-containing film without any nitrification treatment. The present inventors have found that a thin film of metal material or of metal nitride being not lattice-matched with the surface of base substrate (in case that the metal element-containing film is formed directly on a hetero-substrate, with the surface of hetero-substrate, or else in case that a group III nitride semiconductor film has been formed on a hetero-substrate, with the group III nitride semiconductor film) is formed, and thereby the thin film having a fine pore structure can be prepared. In this case, there is no necessity that after the thin film of metal or metal nitride is formed, the film is always subjected to a nitrification treatment or a heat treatment. As the thin film of metal or metal nitride is different from the base substrate in crystal structure and lattice constant, a large strain is exerted within the thin film. As a result, it is considered that pores are generated at the boundaries of crystal grains, which gives rise to formation of a fine pore structure. When crystal growth for a group III nitride semiconductor layer is conducted thereon, the group III nitride semiconductor layer partakes of the epitaxial information of the base substrate through the fine pores. The crystals growing upon the thin film are combined with each other through process of lateral growth, thereby a continuous film of the nitride is formed, but a large number of fine voids are produced at said interface between the thin film and the group III nitride semiconductor layer.

Incidentally, said structure containing fine pores can be produced by adjusting the conditions for layer-growth of film of a metal or metal nitride, but also it can be formed by conducting a heat treatment properly after the formation of a metal or metal nitride film. The conditions of the heat treatment for formation of voids are appropriately selected depending upon the material used for the metal element-containing film. For instance, when a titanium film is formed, the temperature of its heat treatment is preferably 700° C. or higher, more preferably 800° C. or higher. When the temperature is too low, there are some cases that the efficiency of formation of voids may be lowered. The upper limit for the temperature of heat treatment is fixed appropriately based upon such a factor as the material for the film growth, but it is preferably 1,400° C. or less in the case of a GaN based material.

(Embodiment 3)

The embodiment 3 belongs to type III explained above. The pre-step of heating up for growth of a layer of the nitride may be conducted using only a $H_2$ atmosphere. By selecting this condition, before being buried, the surface of TiN is exposed to a $H_2$ atmosphere to promote the elimination of N, whereby Ti can be partially exposed thereon. As a result, the decomposing action for group III nitride semiconductor, which Ti possesses, becomes striking, and thereby region of voids are formed preferably.

In the present embodiment, when a layer of the nitride semiconductor is grown on the metal element-containing film, the V/III ratio is set at <10 at least at the initial stage of the growth. By conducting the growth under a condition relatively rich in Ga, elimination of N from TiN is promoted at the initial stage of growth, whereby Ti of high catalytic activity can be exposed at the surface thereof.

EXAMPLES

Reference Example

A film of Ti metal with a thickness of 30 nm was formed by evaporation on the C plane of a single crystalline sapphire substrate with a diameter of 2 inches. The resulting substrate was placed in an electric furnace and subjected to a heat treatment of 1,050° C.×30 minutes in a $N_2$ gas stream mixed with $NH_3$ in 20% to convert the surface of the Ti film into its nitride. Then, the substrate was heated up to 1,040° C. in a $N_2$ atmosphere, and GaN was deposited thereon in a thickness of about 500 nm to form a HVPE-GaN layer. $N_2$ was employed as the carrier gas. The section of the substrate obtained was observed by a scanning electron microscope (SEM). As a result, it was confirmed that a large number of voids were produced above the Ti film to form a porous layer.

In addition, when a similar experiment was conducted by replacing the film of Ti metal with a film of cobalt, it was confirmed that a large number of voids were produced above the cobalt film to form a porous layer. Furthermore, when similar experiments were conducted for a nickel film and a platinum film, it was confirmed that a large number of voids were produced above these films to form a porous layer.

Based on the results of these experiments, the present inventors further carried out experiments in detail using a Ti film and gave further study thereto. The present invention is explained in more detail below by referring to Examples. The details of process conditions used in each Example and the results measured therein are summarized in Table 1. Incidentally, in each Example except Example 2, silicon as an impurity was doped at a concentration of $5 \times 10^{17}$ cm$^{-3}$ in growth of a GaN layer lying just on a film of Ti, TiN or the like.

Example 1

Explanation of each of the steps of the present Example is made referring to FIG. 1. First, on the C plane of a single crystalline sapphire substrate 11 with a diameter of 2 inches [FIG. 1(a)], a film of Ti metal 12 with a thickness of 30 nm was formed by evaporation at a rate of film formation of 0.8 nm/s [FIG. 1(b)]. The resulting substrate was loaded into a HVPE furnace, and a first GaN layer 13 was grown in a thickness of 1 μm at 750° C., using GaCl and $NH_3$ as the raw materials [FIG. 1(c)]. Then, in the same furnace, the substrate was heated up to a temperature of 1,050° C. and the heat treatment thereto was conducted in a stream of $NH_3$ for 30 minutes; thereby, the film of Ti metal 12 was converted into a TiN film 15 and voids 14 were formed in the first GaN layer [FIG. 1(d)]

Successively, in the same furnace, on the first GaN layer 13, a Si-doped second GaN layer 16 in a thickness of 250 μm was grown, at 1,050° C. using GaCl and $NH_3$ as the raw materials and $SiH_2Cl$ as the dopant [FIG. 1(e)]. Incidentally, these growths were performed under the normal pressure, and a gas mixture blending of 10% of $H_2$ and 90% of $N_2$ (by volume) was used as the carrier gas. The V/III ratio of the gases used for growth was set at 10.

After the growth of the second GaN layer 16 was ended, the layered product of the first GaN layer 13 and the second GaN layer 16 was peeled off spontaneously from the sapphire substrate 11 at the cooling-down stage to obtain a self-supported GaN substrate. At the interface of the GaN substrate peeled off, voids 14 were placed on its surface, and thus microscopic roughness was observed over on the whole surface. This surface with roughness was polished using a diamond abrasive to finish into a mirror-flat. As a result, a self-supported substrate of single crystalline GaN 17 was obtained [FIG. 1(f)].

When the warp was measured for the self-supported GaN substrate 17, it was confirmed that as the radius of curvature for the warp of the substrate was about 10 m, the very flat substrate was indeed obtained. In addition, when the top surface of the self-supported GaN substrate 17, which was a surface opposite to said side for peeling off the base substrate, was observed by an atomic force microscope to measure the surface density of pits, it was confirmed that as the density was at a low level of $2 \times 10^6$ cm$^{-2}$, obtained was a substrate with a high crystalline quality.

Figure 2:
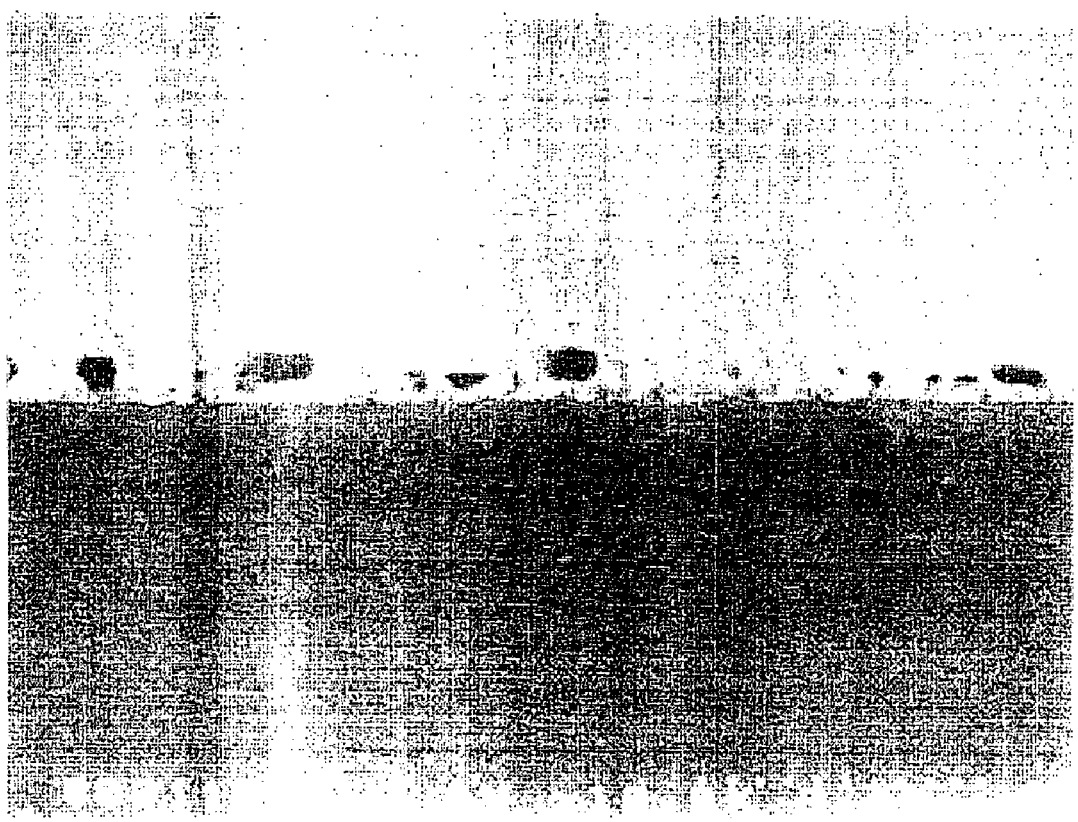
FIG. 2 is a graphic image showing the result of SEM observation described in Example 1.

When the part way steps up to that of FIG. 1(e) were conducted in the same manner as above, with exception that a second GaN layer 16 in a thickness of several μms was grown; and then, the resulting substrate was cut to observe its section using a SEM (scanning electron microscope), it was confirmed that it was formed in such a structure where a GaN layer having voids was lying above a sapphire substrate via a TiN layer, as shown in FIG. 2, and a flat GaN layer was deposited thereon. Incidentally, the ratio of voids included in the first GaN layer 13 that was estimated from the photographical image of section SEM was about 50%. It is considered that the high crystalline quality and flatness of the crystal grown in the present process owes to the fact that the first GaN layer 13 having voids is lying therebetween.

Example 2

Figure 3:
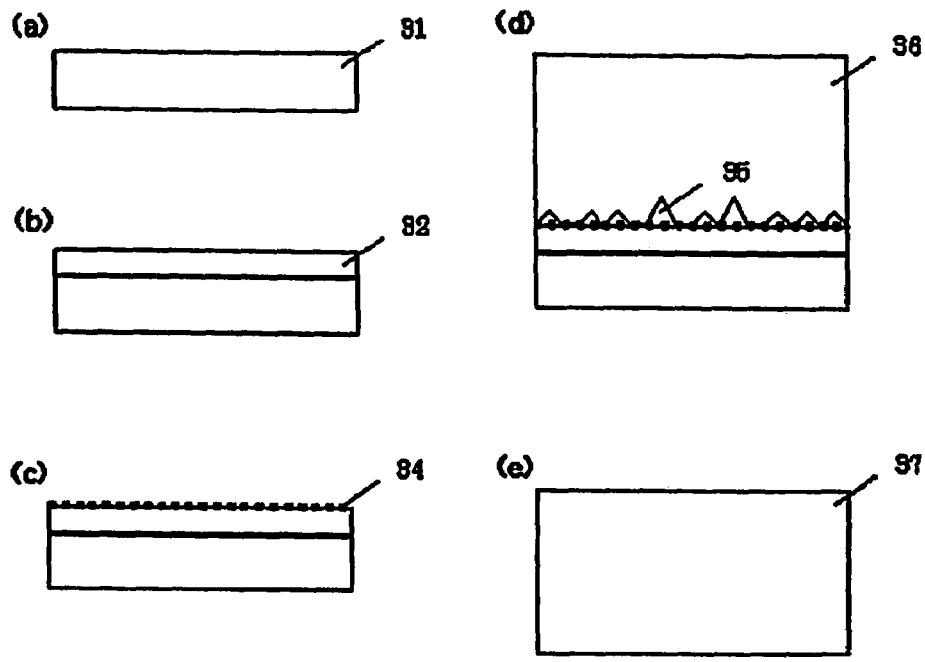
FIGS. 3(a) to 3(e) are each a sectional view showing a step in the process for production of semiconductor substrate according to the present invention, used in Example 2.
Figure 4:
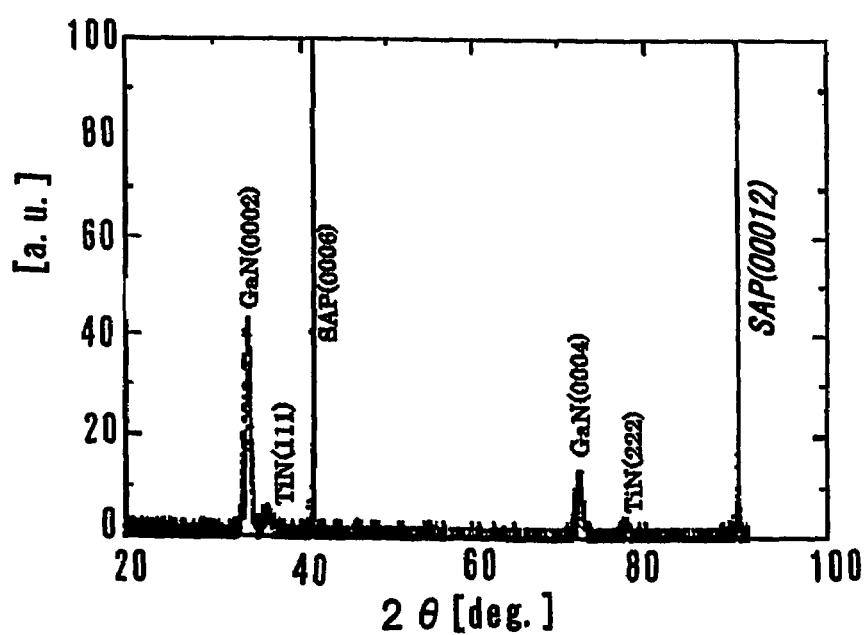
FIG. 4 is a spectrum showing the result of X-ray diffractometry measured for TiN film, explained in Example 4.

Explanation of each of the steps of the present Example is made referring to FIG. 3. On the C plane of a single crystalline sapphire substrate 31 with a diameter of 2 inches [FIG. 3(a)], an undoped GaN layer 32 in a thickness of 1 μm was grown using TMG and $NH_3$ as the raw materials by means of MOVPE method [FIG. 3(b)]. On the GaN epitaxial substrate obtained thereby, TiN in a thickness of 20 nm was deposited at 800° C. using $TiCl_4$ and $NH_3$ as the raw materials by means of CVD method, to prepare a TiN film 34 [FIG. 3(c)]. The rate of film formation thereof was set at about 1 nm/s. When the sample was analyzed by X-ray diffractometry, it was confirmed that as fine diffraction peaks of TiN were observed, as shown in FIG. 4, the TiN film 34 was a film being oriented in a [111] direction.

Figure 5:
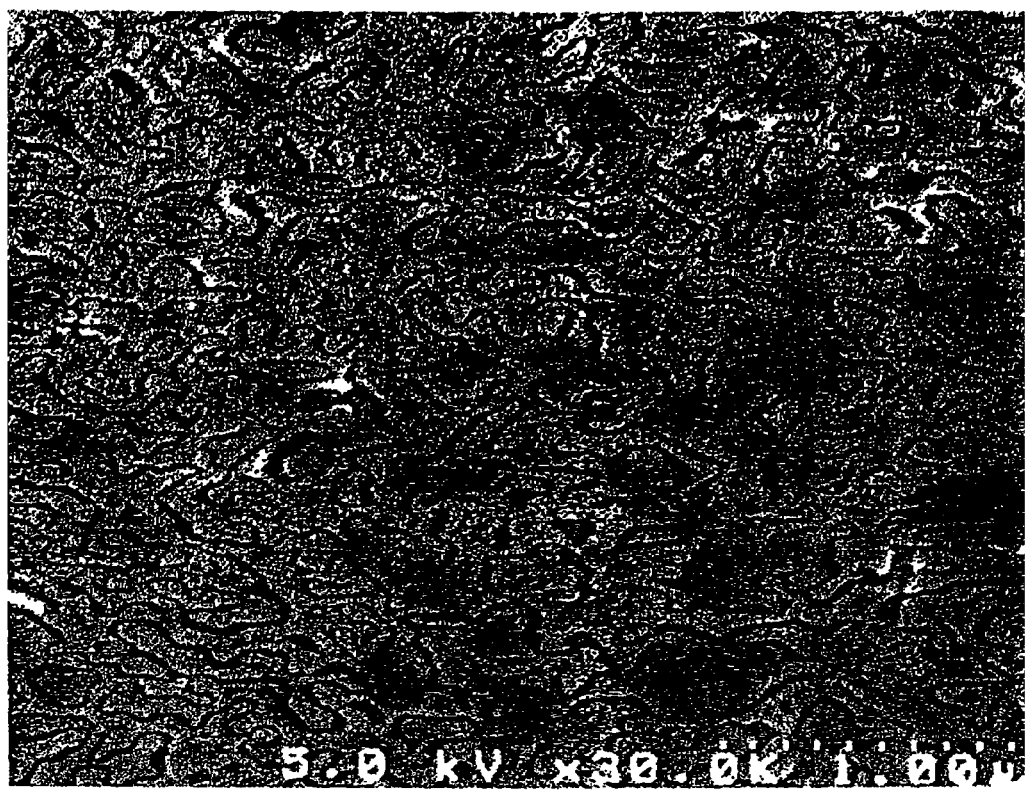
FIG. 5 is a graphic image showing the result of SEM observation described in Example 2: (a) is a SEM image for the surface and (b) is a SEM image for the section.
Figure 5:
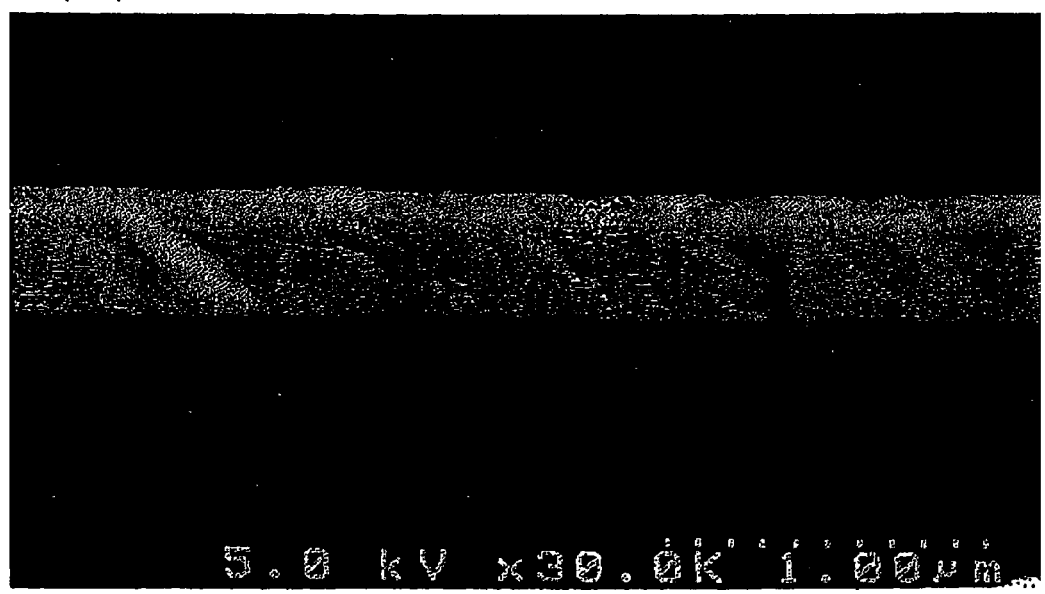

Further, when the surface and section of the sample after the step of FIG. 3(c), in which the TiN film 34 has been formed, were observed by SEM, they were observed in such structures as shown in FIG. 5. FIG. 5(a) is a view showing a top view of the TiN film 34, and FIG. 5(b) is a sectional view of the TiN film 34. Fine pores of submicron order were uniformly formed on the surface of the TiN film, and thus it was in such a state that the surface of GaN crystal used as the basal layer thereof was exposed partially thereon.

Such substrate was loaded in a HVPE furnace and was heated up to 1,040° C. in an $N_2$ atmosphere, and then GaN in a thickness of 300 Am was deposited thereon to prepare a HVPE-GaN layer 36 [FIG. 3(d)]. The raw materials used in the growth were $NH_3$ and GaCl. On the other hand, the partial pressures of GaCl and $NH_3$ in the gas supplied therefor were $8\times10^{-3}$ atm. and $8\times10^{-2}$ atm., respectively. The growth was conducted at normal pressure and the growth temperature was 1,040° C. $N_2$ was employed as the carrier gas. The reason for use of $N_2$ as the carrier gas is because formation of voids 35 above the TiN film is promoted thereby. A similar effect is obtained by using an inert gas such as Ar or He in place of $N_2$.

The HVPE-GaN layer 36 was peeled off spontaneously from the sapphire substrate 31 with the voids 35 used as the site of peeling, at the cooling-down stage after the completion of growth. At the interface of the HVPE-GaN layer 36 peeled off, voids 35 were placed on its surface, and thus microscopic roughness was observed over on the whole surface. This surface with roughness was polished using a diamond abrasive to finish into a mirror-flat. As a result, a self-supported substrate of single crystalline GaN 37 was obtained [FIG. 3(e)].

The surface of the self-supported GaN substrate 37 was very flat and, from observation by a microscope and a SEM, it was revealed that it was such excellent surface condition that was equivalent to or superior to that of a conventional GaN layer grown on a sapphire substrate via a low-temperature-grown buffer layer. Further, when for other sample produced in the same manner as above, the ratio of voids included in the GaN layer was estimated from the photographic image of section SEM, it was about 50%.

When the warp was measured for the self-supported GaN substrate 37, it was confirmed that as the radius of curvature for the warp of the substrate was about 12 m, obtained was indeed a very flat substrate. In addition, when the top surface of the self-supported GaN substrate 37, which was a surface opposite to said side for peeling off the base substrate, was immersed in a hot (250° C.) mixture of phosphoric acid and sulfuric acid and then the etch pits formed thereby was observed to measure for dislocation density, it was confirmed that as the density was at a very low level of $1\times10^6$ pits/cm², obtained was a substrate with a high crystalline quality.

Example 3

Figure 6:
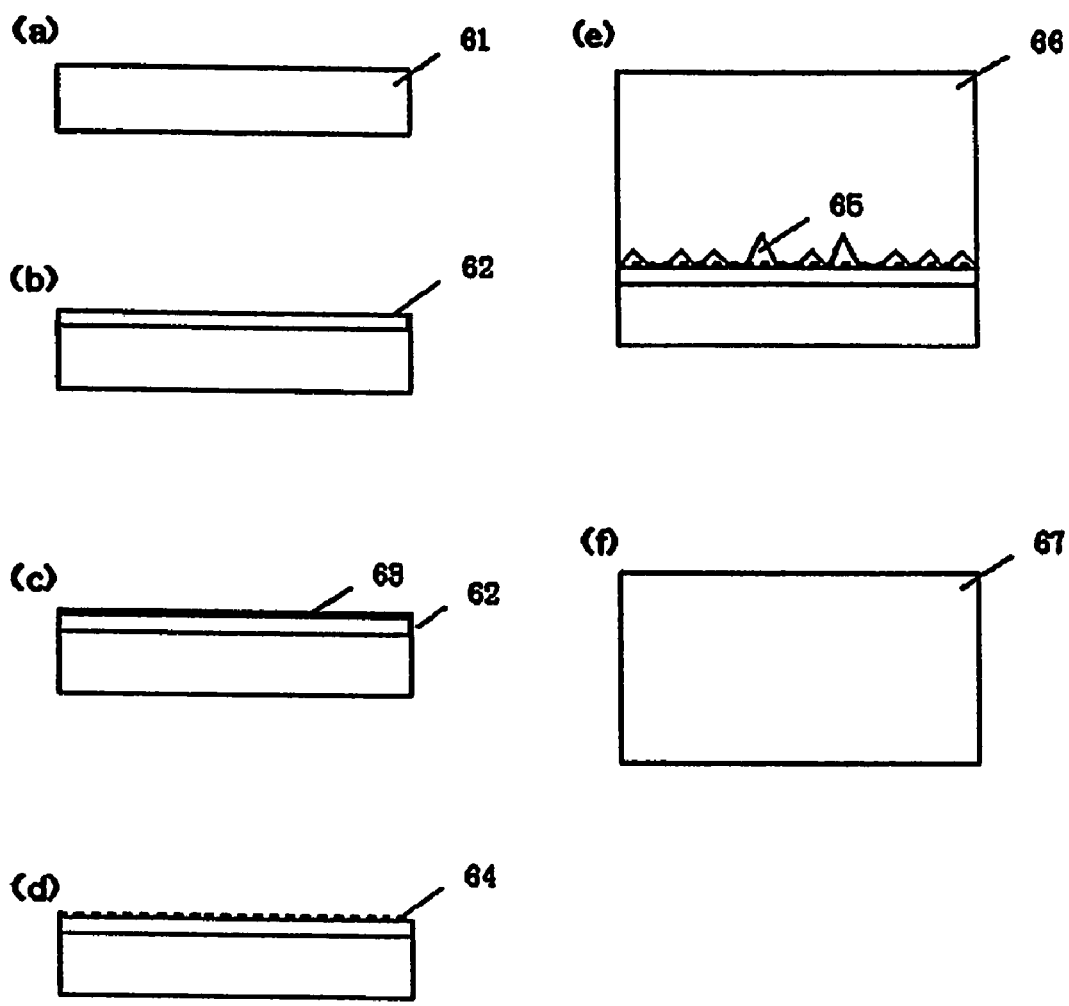
FIGS. 6(a) to 6(f) are each a sectional view showing a step in the process for production of semiconductor substrate according to the present invention, used in Example 3 and Example 4.

Explanation of each of the steps of the present Example is made referring to FIG. 6. On the C plane of a single crystalline sapphire substrate 61 with a diameter of 2 inches [FIG. 6(a)], an undoped GaN layer 62 in a thickness of 1 μm was grown using TMG and $NH_3$ as the raw materials by means of MOVPE method [FIG. 6(b)]. On the GaN epitaxial substrate obtained thereby, a film of Ti metal 63 with a thickness of 20 nm was formed by evaporation [FIG. 6(c)]. The rate of film formation was 0.8 nm/s. This substrate was loaded in an electric furnace and subjected to a heat treatment of 1,050° C.×30 minutes in a $N_2$ gass stream mixed with $NH_3$ in 20% to form a TiN film 64 [FIG. 6(d)]. When the surface and section thereof were observed by a SEM, fine pores of submicron order were uniformly formed on the surface of the TiN film, and thus it was in such a state that the surface of GaN crystal used as the basal layer thereof was exposed partially thereon.

Such substrate was loaded in a HVPE furnace and was heated up to 1,040° C. in an $N_2$ atmosphere, and then GaN in a thickness of 300 μm was deposited thereon to prepare a HVPE-GaN layer 66 [FIG. 6(e)]. The growth of this layer was conducted in two-step process.

The raw materials used at the first growth step were $NH_3$ and GaCl. On the other hand, the partial pressures of GaCl and $NH_3$ in the gas supplied therefor were $8\times10^{-3}$ atm. and $5.6\times10^{-2}$ atm., respectively, and the V/III ratio was set at 7. The growth was conducted at normal pressure and $N_2$ mixed with $H_2$ in 10% was used as the carrier gas. GaN was grown in as a thick thickness as 20 μm under the above condition; after that, the carrier gas was switched to $H_2$ and successively the second step GaN growth was carried out. In this step, the partial pressures of GaCl and $NH_3$ in the gas supplied for the growth using a $H_2$ carrier gas were $1\times10^{-2}$ atm. and $2.5\times10^{-1}$ atm., respectively. By the two-step growth mentioned above, a GaN layer of 300 μm in thickness was grown up. The surface of the GaN layer showed inhibition of abnormal growth and improvement in surface morphology, as compared with the case where the whole growth was conducted in a $N_2$ carrier gas. The HVPE-GaN layer 66 was peeled spontaneously from the sapphire substrate 61 with the voids 65 used as the site of peeling, in the cooling down stage after the completion of growth. At the peeling interface of the HVPE-GaN layer 66 peeled off, voids 65 were placed on its surface, and thus microscopic roughness was observed over on the whole surface. This surface with roughness was polished using a diamond abrasive to finish into a mirror-flat. As a result, a self-supported substrate of single crystalline GaN 67 was obtained [FIG. 6(f)].

The surface of the self-supported GaN substrate 67 was very flat and, from observation by a microscope and a SEM, it was revealed that it was such excellent surface condition that was equivalent to or superior to that of a conventional GaN layer grown on a sapphire substrate via a low-temperature-grown buffer layer. Further, when for other sample produced in the same manner as above, the ratio of voids included in the GaN layer was estimated from the photographic image of section SEM, it was about 50%.

When the warp was measured for the self-supported GaN substrate 67, it was confirmed that as the radius of curvature for the warp of the substrate was about 11 m, obtained was indeed a very flat substrate. In addition, when the top surface of the self-supported GaN substrate 67, which was a surface opposite to said side for peeling off the base substrate, was immersed in a hot (250° C.) mixture of phosphoric acid and sulfuric acid and then the etch pits formed thereby was observed to measure for dislocation density, it was confirmed that as the density was at a very low level of $1\times10^6$ pits/cm², obtained was a substrate with a high crystalline quality.

Example 4

Explanation of each of the steps of the present Example is made referring to FIG. 6. On the C plane of a single crystalline sapphire substrate 61 with a diameter of 2 inches

[FIG. 6(a)], an undoped GaN layer 62 in a thickness of 1 μm was grown using TMG and NH$_3$ as the raw materials by means of MOVPE method [FIG. 6(b)]. On the GaN epitaxial substrate obtained thereby, a film of Ti metal 63 with a thickness of 20 nm was formed by evaporation [FIG. 6(c)]. The rate of film formation was 0.8 nm/s. This substrate was loaded in an electric furnace and subjected to a heat treatment of 1,050° C.×30 minutes in a N$_2$ gas stream mixed with NH$_3$ in 20% to form a TiN film 64 [FIG. 6(d)]. When the surface and section thereof were observed by a SEM, fine pores of submicron order were uniformly formed on the surface of the TiN film, and thus it was in such a state that the surface of GaN crystal used as the basal layer thereof was exposed partially thereon.

The substrate obtained thereby was loaded in a HVPE furnace and was heated up to 1,040° C. in a H$_2$ atmosphere, and then GaN in a thickness of 300 μm was deposited thereon. The growth of this layer was conducted in two-step process.

The raw materials used in the first growth step were NH$_3$ and GaCl. The partial pressures of GaCl and NH$_3$ in the in the gas supplied therefor were $8\times10^{-3}$ atm and $1\times10^{-1}$ atm with the V/III ratio of 12.5, respectively, and the growth was conducted at normal pressure and N$_2$ was used as the carrier gas. GaN was grown in as a thick thickness as 20 μm under the above condition; and next to that, the carrier gas was switched to H$_2$ and successively the second step GaN growth was carried out. In this step, the partial pressures of GaCl and NH$_3$ in the gas supplied for the growth using a H$_2$ carrier gas were $1\times10^{-2}$ atm. and $2.5\times10^{-1}$ atm., respectively. By the two-step growth mentioned above, a GaN layer of 300 μm in thickness was grown up.

The surface of the GaN layer showed inhibition of abnormal growth and improvement in surface morphology, as compared with the case where the whole growth was conducted in a N$_2$ carrier gas. The HVPE-GaN layer 66 was peeled spontaneously from the sapphire substrate 61 with the voids 65 used as the site of peeling, in the cooling down stage after the completion of growth. At the peeling interface of the HVPE-GaN layer 66 peeled off, voids 65 were placed on its surface, and thus microscopic roughness was observed over on the whole surface. This surface with roughness was polished using a diamond abrasive to finish into a mirror-flat. As a result, a self-supported substrate of single crystalline GaN 67 was obtained [FIG. 6(f)].

The surface of the self-supported GaN substrate 67 was very flat and, from observation by a microscope and a SEM, it was revealed that it was such excellent surface condition that was equivalent to or superior to that of a conventional GaN layer grown on a sapphire substrate via a low-temperature-grown buffer layer. Further, when for other sample produced in the same manner as above, the ratio of voids included in the GaN layer was estimated from the photographic image of section SEM, it was about 60%.

When the warp was measured for the self-supported GaN substrate 67, it was confirmed that as the radius of curvature for the warp of the substrate was about 11 m, obtained was indeed a very flat substrate. In addition, when the top surface of the self-supported GaN substrate 67, which was a surface opposite to said side for peeling off the base substrate, was immersed in a hot (250° C.) mixture of phosphoric acid and sulfuric acid and then the etch pits formed thereby was observed to measure for dislocation density, it was confirmed that as the density was at a very low level of $9\times10^5$ pits/cm$^2$, obtained was a substrate with a high crystalline quality.

In the present Example as mentioned above, the surface of the TiN film was subjected to a treatment of reduction in a H$_2$ atmosphere. In place of such a treatment, it may be subjected to a wet treatment using a HF solution. For instance, voids 65 may be preferably formed in the GaN layer by such a treatment that it is immersed in HF for 30 minutes, followed by washing with water.

Comparative Example 1

In the present Comparative Example, on the C plane substrate of a single crystalline sapphire of 2 inches in diameter, a Ti film was formed, by evaporation, in a thickness of 100 nm with a film formation rate of 2 nm/s, and a gold film used for oxidation prevention was formed, by evaporation in a thickness of 10 to 20 nm. The substrate was loaded in an MBE chamber (a molecular beam epitaxial growth chamber), and then a GaN layer (thickness: 0.5 μm) was grown thereon at 700° C. In the present Comparative Example, formation of voids in the GaN layer lying on the gold film is prevented.

When the substrate taken out of the MBE chamber was immersed in hydrofluoric acid, the Ti film was selectively etched, but thereafter the GaN epitaxial layer was cracked to pieces.

The experimental conditions of the above Examples and Comparative Example as well as the results measured therein are shown in Table 1. In the table, the symbol in "process" indicates to which one of the aforementioned types I to IV the case is corresponding; and if it is the case corresponding to a plurality of types, the main types intended by the Example are shown. "GaN growth" indicates the growth conditions for GaN to be formed just on a film of Ti or TiN.

It has been definitely shown thereby that in each of the Examples, a porous layer containing regions of voids was formed; thereby, peeling of base substrate was easy, the warp of the resulting substrate was strikingly reduced, and the defect density at the surface of the substrate was significantly diminished.

TABLE 1

|  | Example 1 | Example 2 | Example 3 | Example 4 | Comp. Example 1 |
|---|---|---|---|---|---|
| Process | I | II | IV | II, III | — |
| Metal element-containing film: Material and structure | Ti | TiN with fine pores | Ti/TiN with fine pores | Ti/TiN with fine pores | Ti/Au |
| Metal element-containing film: Thickness (nm) | 30 | 20 | 20 | 20 | 100 |
| Metal element-containing film: Film formation method | Evaporation | CVD 800° C. | Evaporation | Evaporation | Evaporation |

TABLE 1-continued

| | Example 1 | Example 2 | Example 3 | Example 4 | Comp. Example 1 |
|---|---|---|---|---|---|
| Metal element-containing film: Film formation rate (nm/s) | 0.8 | 1 | 0.8 | 0.8 | 2 |
| Method of formation for GaN | HVPE | HVPE | HVPE | HVPE | MBE |
| Pre-treatment prior to GaN growth | No | No | No | Reduction (hydrogen) | No |
| Carrier gas composition used for GaN growth | $H_2$ 10%/$N_2$ 90% | $N_2$ | $H_2$ 10%/$N_2$ 90% | $N_2$ | $N_2$ |
| Kind of raw material gas used for GaN growth | $NH_3$/GaCl | $NH_3$/GaCl | $NH_3$/GaCl | $NH_3$/GaCl | — |
| V/III ratio used for GaN growth | 10 | 10 | 7 | 12.5 | — |
| Temperature used for GaN growth (° C.) | 750/1040 | 1040 | 1040 | 1040 | — |
| Si concentration ($cm^{-1}$) in GaN growth | $5 \times 10^{17}$ | Non-doped | $5 \times 10^{17}$ | $5 \times 10^{17}$ | $5 \times 10^{17}$ |
| Voids ratio in GaN layer (%) | 50 | 50 | 50 | 60 | — |
| Defect density on substrate surface ($cm^{-2}$) | $2 \times 10^6$ | $1 \times 10^6$ | $1 \times 10^6$ | $0.9 \times 10^6$ | — |
| Curvature of substrate warp (m) | 10 | 12 | 11 | 13 | — |
| Method of substrate peeling | Spontaneous peeling | Spontaneous peeling | Spontaneous peeling | Spontaneous peeling | Etching |

The present invention has been explained above based on Examples. It is apparent to person skilled in the art that the present invention can take various modified forms as long as the gist of the present invention remains unchanged. Description is made below on these modified forms.

In the above Examples, was employed, as the base substrate, a sapphire substrate whose C plane was chosen as a plane for growth. However, there may be used a sapphire substrate whose A plane is chosen as a plane for growth. An A plane of sapphire, as compared with a C plane of sapphire, can be allowed to have a large diameter with ease and enables production of a group III nitride semiconductor substrate of large diameter.

In addition, in the above Examples, there were illustrated cases of application of the present invention to the production of a GaN substrate. The present invention may also be applied to the production of a self-supported single crystalline substrate of three-element alloy such as aluminum gallium nitride or gallium indium nitride, or to the production of a substrate of p type GaN doped with Mg or the like.

Further, in the above Examples, a Ti film was used as the metal film. A film composed of other metal material may be used. The study by the present inventors confirmed that also when there is used platinum, nickel, tungsten or the like as the material for metal film, voids can be formed in a group III nitride semiconductor layer formed thereon. Therefore, a metal film as well as metal nitride film being composed of such a metal material may be used. Also, a film of metal alloy may be used. Such a process may be employed in which after an element having a surfactant effect, such as silicon, is absorbed on the surface of the metal film, GaN is grown thereon, whereby defect density is reduced into a lower level.

Furthermore, In the formation of a TiN film having fine pores, a method of self-formation thereof with convenience was used. Of course, after the film formation by sputtering, such fine pores may also be formed thereon by means of photolithography.

On the other hand, in formation of a GaN layer on a Ti or TiN film, selective growth using a mask, such as ELO, FIELO or the like may also be employed.

The group III nitride semiconductor substrate obtained by the present invention can be used widely as a substrate for GaN based device. As a high-quality GaN based crystal that is low in defect density can be obtained with use of said substrate as a substrate for laser diode, it can promise production of a laser diode of high reliability and high performance.

INDUSTRIAL APPLICABILITY

As explained above, according to the present invention, voids are formed in a group III nitride semiconductor layer; thereby, a group III nitride semiconductor substrate having low defect density and little warp can be obtained. It is because the layer containing voids functions as a strain-relaxing regions and the base substrate can be peeled easily from the region of voids to remove it therefrom.

The invention claimed is:

1. A process for producing a group III nitride semiconductor substrate, characterized in that the process comprises steps of:
    forming a film containing metal element on a base substrate,
    forming a group III nitride semiconductor layer including region of voids therein on the metal element-containing film to be brought into direct contact therewith, and
    peeling said base substrate with use of said region of voids as a site for peeling to take it away,
    wherein said metal element-containing film contains a metal element possessing a decomposing action on a group III nitride semiconductor used for said group III nitride semiconductor layer, and
    wherein said region of voids, which is caused by partial decomposition of the group III nitride semiconductor due to a decomposing action of the metal element contained in the metal element-containing film, is formed in direct contact with said metal element-containing film.

2. A process for producing a group III nitride semiconductor substrate claimed in claim 1, wherein said metal element is a transition element.

3. A process for producing a group III nitride semiconductor substrate claimed in claim 1, wherein said metal element is scandium, yttrium, titanium, zirconium, hafnium, vanadium, niobium, tantalum, chromium, molybdenum, tungsten, rhenium, iron, ruthenium, osmium, cobalt, rhodium, iridium, nickel, palladium, manganese, copper, platinum or gold.

4. A process for producing a group III nitride semiconductor substrate claimed in claim 3, wherein said metal element is titanium, zirconium, hafnium, tantalum, platinum, cobalt or nickel.

5. A process for producing a group III nitride semiconductor substrate, characterized in that the process comprises steps of:
   forming a film containing metal element on a base substrate,
   growing a first group III nitride semiconductor layer on the metal element-containing film to be brought into direct contact therewith,
   heat-treating said metal element-containing film and said first group III nitride semiconductor layer at a temperature higher than a growth temperature for the first group III nitride semiconductor layer to form region of voids in said first group III nitride semiconductor layer,
   forming a second group III nitride semiconductor layer on said first group III nitride semiconductor layer, and
   peeling said base substrate with use of said region of voids as a site for peeling to take it away.

6. A process for producing a group III nitride semiconductor substrate claimed in claim 5, wherein said growth temperature for the first group III nitride semiconductor layer is within the range of 400° C. or higher but 800° C. or lower.

7. A process for producing a group III nitride semiconductor substrate claimed in claim 5, wherein the heat treatment of said metal element-containing film and said first group III nitride semiconductor layer is conducted at a temperature of 900° C. or higher but 1,400° C. or lower.

8. A process for producing a group III nitride semiconductor substrate claimed in claim 5, wherein the thickness of said first group III nitride semiconductor layer is in the range of 20 nm or thicker but 2,000 nm or thinner.

9. A process for producing a group III nitride semiconductor substrate claimed in claim 5, wherein said metal element-containing film is a metal film.

10. A process for producing a group III nitride semiconductor substrate claimed in claim 5, wherein said metal element-containing film contains a metal element having a decomposing action on a group III nitride semiconductor used for said first group III nitride semiconductor layer.

11. A process for producing a group III nitride semiconductor substrate claimed in claim 10, wherein said metal element is a transition element.

12. A process for producing a group III nitride semiconductor substrate claimed in claim 10, wherein said metal element is scandium, yttrium, titanium, zirconium, hafnium, vanadium, niobium, tantalum, chromium, molybdenum, tungsten, rhenium, iron, ruthenium, osmium, cobalt, rhodium, iridium, nickel, palladium, manganese, copper, platinum or gold.

13. A process for producing a group III nitride semiconductor substrate claimed in claim 12, wherein said metal element is titanium, zirconium, hafnium, tantalum, platinum, cobalt or nickel.

14. A process for producing a group III nitride semiconductor substrate, characterized in that the process comprises steps of:
   forming, on a base substrate, a metal element-containing film having a fine pore structure therein,
   forming a group III nitride semiconductor layer including region of voids therein on the metal element-containing film to be brought into direct contact therewith, and
   peeling said base substrate with use of said region of voids as a site for peeling to take it away,
   wherein said metal element-containing film contains a metal element possessing a decomposing action on a group III nitride semiconductor used for the group III nitride semiconductor layer,
   wherein said region of voids, which is caused by partial decomposition of the group III nitride semiconductor due to a decomposing action of the metal element contained in the metal element-containing film, is formed in direct contact with said metal element-containing film.

15. A process for producing a group III nitride semiconductor substrate claimed in claim 14, wherein said metal element is a transition element.

16. A process for producing a group III nitride semiconductor substrate claimed in claim 14, wherein said metal element is scandium, yttrium, titanium, zirconium, hafnium, vanadium, niobium, tantalum, chromium, molybdenum, tungsten, rhenium, iron, ruthenium, osmium, cobalt, rhodium, iridium, nickel, palladium, manganese, copper, platinum or gold.

17. A process for producing a group III nitride semiconductor substrate claimed in claim 16, wherein said metal element is titanium, zirconium, hafnium, tantalum, platinum, cobalt or nickel.

18. A process for producing a group III nitride semiconductor substrate, characterized in that the process comprises steps of:
   forming, on a base substrate, a metal element-containing film, at least a surface of which is composed of a metal nitride,
   carrying out treatment for elimination of the nitrogen contained in said metal nitride,
   forming a group III nitride semiconductor layer including region of voids therein on the metal element-containing film to be brought into direct contact therewith, and
   peeling said base substrate with use of said region of voids as a site for peeling to take it away.

19. A process for producing a group III nitride semiconductor substrate claimed in claim 18, wherein said step of forming the metal element-containing film comprises, after formation of a metal film on said base substrate, a step of treatment for nitrification of the metal film.

20. A process for producing a group III nitride semiconductor substrate claimed in claim 18, wherein said metal element-containing film is a metal nitride film.

21. A process for producing a group III nitride semiconductor substrate claimed in claim 18, wherein said treatment for elimination of nitrogen is a treatment in which said metal element-containing film is exposed to a reducing atmosphere.

22. A process for producing a group III nitride semiconductor substrate, characterized in that the process comprises steps of:
   forming, on a base substrate, a metal element-containing film, at least a surface of which is composed of a metal nitride,
   growing a group III nitride semiconductor layer on the metal element-containing film to be brought into direct contact therewith under condition that a V/III ratio of raw material gas is set to be from 7 to 10 to form group III nitride semiconductor layer including region of voids therein, and peeling said base substrate with use of said region of voids as a site for peeling to take it away.

23. A process for producing a group III nitride semiconductor substrate claimed in claim 22, wherein said metal element-containing film contains a metal element having a decomposing action on a group III nitride semiconductor used for the group III nitride semiconductor layer.

24. A process for producing a group III nitride semiconductor substrate claimed in claim 23, wherein said metal element is a transition element.

25. A process for producing a group III nitride semiconductor substrate claimed in claim 23, wherein said metal element is scandium, yttrium, titanium, zirconium, hafnium, vanadium, niobium, tantalum, chromium, molybdenum, tungsten, rhenium, iron, ruthenium, osmium, cobalt, rhodium, iridium, nickel, palladium, manganese, copper, platinum or gold.

26. A process for producing a group III nitride semiconductor substrate claimed in claim 25, wherein said metal element is titanium, zirconium, hafnium, tantalum, platinum, cobalt or nickel.

27. A process for producing a group III nitride semiconductor substrate claimed in claim 1, wherein said metal element-containing film is formed on an entirety of a surface of said base substrate.

28. A process for producing a group III nitride semiconductor substrate claimed in claim 1, wherein said step of peeling said base substrate to take it away comprises a step of cooling down the temperature of the atmosphere post to the growth of the group III nitride semiconductor layer to spontaneously peel said base substrate off.

29. A group III nitride semiconductor substrate being produced by using a process for producing a group III nitride semiconductor substrate as claimed in claim 1.

30. A group III nitride semiconductor substrate produced by the process of claim 5.

31. A group III nitride semiconductor substrate produced by the process of claim 14.

32. A group III nitride semiconductor substrate produced by the process of claim 18.

33. A group III nitride semiconductor substrate produced by the process of claim 22.

* * * * *